(12) United States Patent
Roy et al.

(10) Patent No.: US 9,099,604 B2
(45) Date of Patent: Aug. 4, 2015

(54) IMAGE SENSOR WITH A CURVED SURFACE

(71) Applicants: STMicroelectronics S.A., Montrouge (FR); STMicroelectronics (Crolles 2) SAS, Crolles (FR)

(72) Inventors: François Roy, Seyssins (FR); Lucile Broussous, Vaulnaveys le Haut (FR); Julien Michelot, Grenoble (FR); Jean-Pierre Oddou, Champagnier (FR)

(73) Assignees: STMicroelectronics (Crolles 2) SAS, Crolles (FR); STMicroelectronics S.A., Montrouge (FR)

( * ) Notice: Subject to any disclaimer, the term of this patent is extended or adjusted under 35 U.S.C. 154(b) by 4 days.

(21) Appl. No.: 13/858,481

(22) Filed: Apr. 8, 2013

(65) Prior Publication Data

US 2014/0004644 A1    Jan. 2, 2014

(30) Foreign Application Priority Data

Apr. 13, 2012    (FR) ...................................... 12 53424

(51) Int. Cl.
*H01L 21/00* (2006.01)
*H01L 31/18* (2006.01)
*H01L 27/146* (2006.01)

(52) U.S. Cl.
CPC .......... *H01L 31/18* (2013.01); *H01L 27/14605* (2013.01)

(58) Field of Classification Search
CPC ..... H01L 27/146; H01L 21/302; H01L 31/18; H01L 31/02

USPC ........ 438/57, 71, 60, 69, 74, 75, 78; 257/466, 257/431, 444, 443, 446, 457, 459, 465, 257/E21.001, E23.179, E21.521–E21.531, 257/E33.001, E31.097, E27.133, E29.255, 257/E21.409, E33.062, E23.011
See application file for complete search history.

(56) References Cited

U.S. PATENT DOCUMENTS

| | | | |
|---|---|---|---|
| 4,290,844 A | 9/1981 | Rotolante et al. | |
| 6,285,400 B1 | 9/2001 | Hokari | |
| 6,627,865 B1 * | 9/2003 | Hamilton et al. | 250/208.1 |
| 7,507,944 B1 * | 3/2009 | Arnzen et al. | 250/208.1 |
| 7,777,260 B2 * | 8/2010 | Katsuno et al. | 257/292 |
| 7,935,559 B1 | 5/2011 | Giffard et al. | |

(Continued)

FOREIGN PATENT DOCUMENTS

| | | |
|---|---|---|
| EP | 2 088 572 A2 | 8/2009 |
| EP | 2 388 987 A1 | 11/2011 |

(Continued)

OTHER PUBLICATIONS

English translation of FP: JP 2004-349545.*

(Continued)

*Primary Examiner* — Amar Movva
*Assistant Examiner* — Sheikh Maruf
(74) *Attorney, Agent, or Firm* — Seed IP Law Group PLLC

(57) ABSTRACT

A method for manufacturing an image sensor, including the successive steps of: forming columns of a semiconductor material; forming one or several pixels at a first end of each of the columns; and deforming the structure so that the second ends of each of the columns come closer to each other or draw away from each other to form a surface in the shape of a polyhedral cap.

27 Claims, 5 Drawing Sheets

(56) References Cited

U.S. PATENT DOCUMENTS

| | | | |
|---|---|---|---|
| 8,536,667 B2 * | 9/2013 | De Graff et al. | 257/419 |
| 8,565,551 B2 * | 10/2013 | Choi et al. | 382/275 |
| 2003/0106208 A1 | 6/2003 | Hosier et al. | |
| 2008/0151089 A1 * | 6/2008 | Street et al. | 348/308 |
| 2009/0102001 A1 * | 4/2009 | Lee | 257/432 |
| 2009/0115875 A1 * | 5/2009 | Choi et al. | 348/294 |
| 2009/0315044 A1 * | 12/2009 | Amundson et al. | 257/88 |
| 2010/0096729 A1 * | 4/2010 | Wong et al. | 257/620 |
| 2010/0099225 A1 * | 4/2010 | Yamada | 438/151 |
| 2010/0140613 A1 * | 6/2010 | Kimura | 257/43 |
| 2010/0207229 A1 | 8/2010 | DeNatale et al. | |
| 2010/0308429 A1 * | 12/2010 | Ma et al. | 257/443 |
| 2011/0108939 A1 * | 5/2011 | Marty et al. | 257/432 |
| 2011/0169122 A1 * | 7/2011 | Oliver et al. | 257/459 |
| 2012/0261732 A1 * | 10/2012 | Marty et al. | 257/292 |
| 2013/0181348 A1 * | 7/2013 | Oliver et al. | 257/737 |

FOREIGN PATENT DOCUMENTS

| | | | |
|---|---|---|---|
| JP | 02004349545 | * | 12/2004 |
| JP | 2004349545 A | * | 12/2004 |
| JP | 2004253509 A | | 9/2009 |
| WO | WO 2010094929 A1 | | 8/2010 |
| WO | WO 2010141657 A2 | | 12/2010 |

OTHER PUBLICATIONS

French Search Report and Written Opinion dated Dec. 19, 2012 from corresponding French Application No. 12/53424.

French Search Report and Written Opinion dated Dec. 6, 2012 from related French Application No. 12/53425.

Rim et al., "The optical advantages of curved focal plane arrays," *Optics Express* 16(7):4965-4971, Mar. 31, 2008.

* cited by examiner

IMAGE SENSOR WITH A CURVED SURFACE

CROSS REFERENCE TO RELATED APPLICATIONS

This application claims the priority benefit of French patent application number 12/53424, filed on Apr. 13, 2012, which is hereby incorporated by reference to the maximum extent allowable by law.

BACKGROUND

1. Technical Field

The present disclosure relates to integrated image sensors with a curved surface and, more specifically, to a method for manufacturing such image sensors.

2. Discussion of the Related Art

An integrated image sensor comprises a large number of elementary cells or pixels which are arranged in an array at the surface of a semiconductor substrate. The surface of the image sensor is generally planar. To focus the image towards the sensor, an optical system is placed in front of the image sensor.

FIG. 1 schematically illustrates a planar image sensor and an optical focusing system enabling to acquire a high-quality image.

FIG. 1 shows an image sensor 10 and the optical system 12 associated therewith. As can be seen in the drawing, in order for image sensor 10 to properly detect an image placed at infinity and slightly inclined with respect to the optical axis of the system, optical system 12 integrates a large number of elementary optical devices 14. In the shown example, optical system 12 comprises six elementary optical devices 14 (for example, lenses), which will not be further detailed herein.

Elementary optical devices 14 enable focusing all the incident light rays passing through a diaphragm 16 towards image sensor 10, and also to correct aberrations due to the fact that image sensor 10 has a planar surface.

Indeed, images at infinity, capable of being detected by an image sensor, are naturally focused on a curved surface and not on a plane. The optical system associated with the sensor of FIG. 1 is thus particularly complex, to take into account the fact that the image sensor is planar.

Image sensors with a curved surface are thus needed.

FIG. 2 schematically illustrates the optics associated with an image sensor having a general curved surface.

In FIG. 2, an image sensor 20 of even curved surface having its center of curvature located on the sensor illumination side is schematically illustrated. An optical system 22 enables to focus all the incident light rays passing through a diaphragm 16 towards image sensor 20. As illustrated in FIG. 2, due to the curvature of sensor 20, optical system 22 is less complex than optical system 12 illustrated in FIG. 1, and only comprises three elementary optical devices 24.

To obtain an image sensor having a curved surface, it has been provided to form image sensor pixels at the surface of a thin membrane, and to then position the thin membrane on a support of curved shape. To improve the deformation capacity of the membrane, a structuration thereof may be provided, at the end of the process, around blocks formed of a large number of pixels. However, membrane structurations performed by etching at the end of the manufacturing process have low-quality interfaces which cannot be restored, wall restoring methods being performed at high temperatures associated with processings of ion implantation and/or wall oxidation type. This implies that sensor pixels close to the etched regions during the structuration may be impossible to use.

Another disadvantage of known methods is that they provide a step of installation of a flexible membrane onto a curved support of adapted shape. This necessitates a large number of manufacturing steps, and thus a non-negligible manufacturing cost.

Thus, there is a need for method for manufacturing an integrated image sensor having a curved surface, which overcomes all or part of the disadvantages of known methods.

SUMMARY

An embodiment provides a method for manufacturing a curved image sensor, as well as the obtained sensor.

More specifically, an embodiment provides such a method which ensures the operation of all the pixels.

Thus, an embodiment provides a method for manufacturing an image sensor, comprising the successive steps of: forming columns of a semiconductor material; forming one or several pixels at a first end of each of the columns; and deforming the structure so that the second ends of each of the columns come closer to each other or draw away from each other to form a surface in the shape of a polyhedral cap.

According to an embodiment, the step of forming of columns comprises a step of definition, in a semiconductor substrate extending on a semiconductor support with an interposed insulating layer, of through trenches delimiting the columns.

According to an embodiment, the step of forming of columns comprises a step of definition, in a solid semiconductor substrate, of trenches delimiting the columns.

According to an embodiment, the columns have dimensions at the surface of the substrate smaller than 10 µm.

According to an embodiment, the method further comprises, after the trench forming step, a step of filling of the trenches with an insulating material.

According to an embodiment, the method further comprises, before the structure deformation step, a step of removal of the insulating material.

According to an embodiment, the step of removal of the insulating material is followed by a step of filling of the trenches with a material.

According to an embodiment, the method further comprises, after the step of forming of columns, a step of forming of an interconnection stack on the side of the first end of the columns.

According to an embodiment, the method further comprises, after the step of forming of an interconnection stack, a step of installation of a handle followed by a removal of the semiconductor support and of the insulating layer.

According to an embodiment, the step of installation of a handle on the interconnection stack is preceded by a step of forming, on the interconnection stack, of a layer of a material capable of deforming with no fracture.

According to an embodiment, the step of installation of a handle on the interconnection stack is preceded by a step of etching of a cavity at the handle surface, the cavity being defined and positioned to coincide, at the installation, with the entire surface defined by the columns.

According to an embodiment, the step of forming of columns is followed by a column wall restoring step.

According to an embodiment, the columns are formed by a plasma etching, a pulsed plasma etching, or a reactive ion etching.

Another embodiment provides an integrated image sensor comprising semiconductor material columns having one or several pixels formed on a first end, the second ends of each of the columns coming close to one another or drawing away from one another to form a surface in the shape of a polyhedral cap.

According to an embodiment, the columns have dimensions at the surface of the substrate smaller than 10 µm.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated image sensors, the various drawings are not to scale.

DETAILED DESCRIPTION

A method for manufacturing a curved image sensor overcoming all or part of the disadvantages of known methods is provided herein.

FIGS. 3 to 11 illustrate results of steps of such a manufacturing method.

Figure 1:
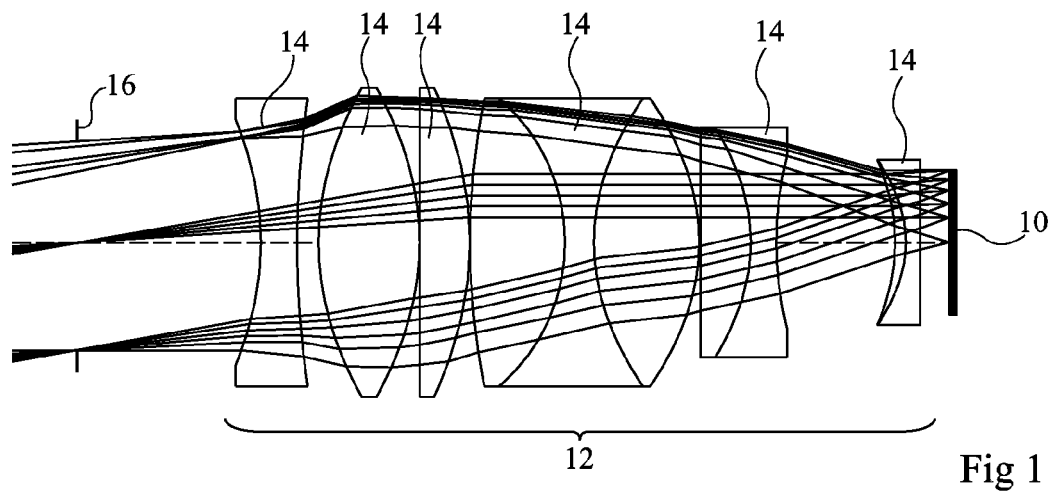
FIGS. 1 and 2, previously described, illustrate optical systems associated with image sensors having a respectively planar and curved general surface.
Figure 2:
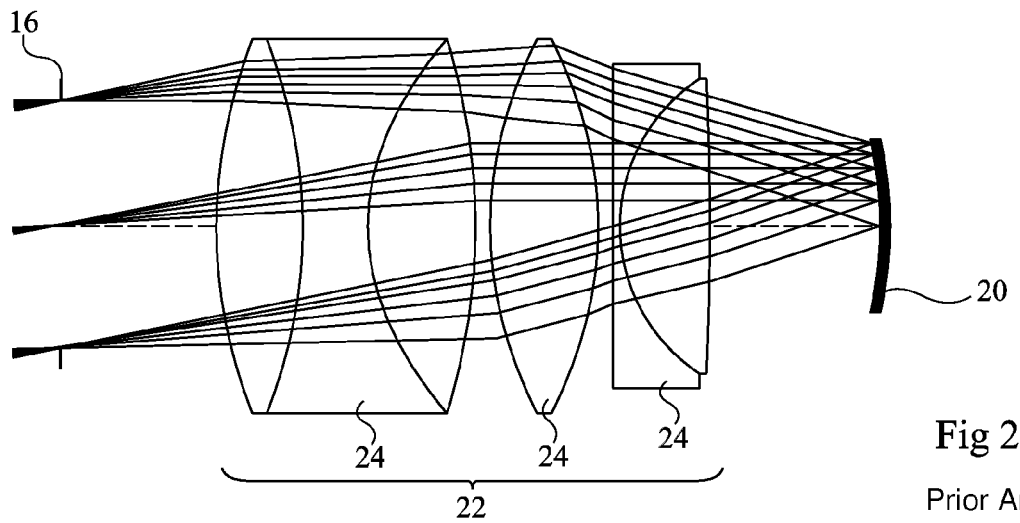
Figure 3:
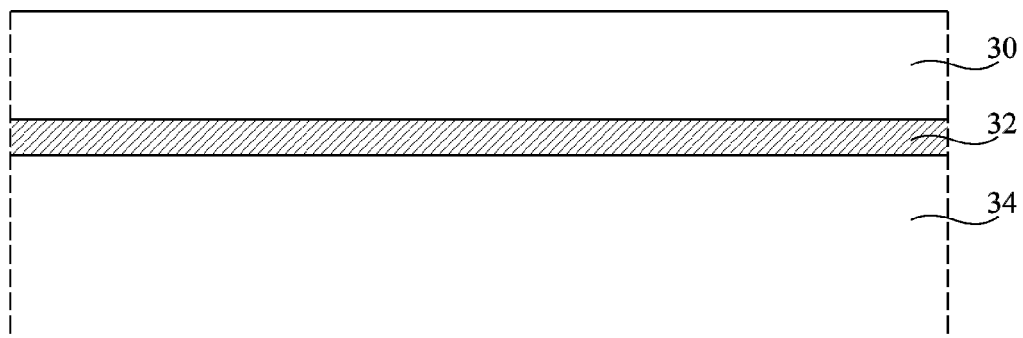
FIGS. 3, 4A, 4B, 5, 6, 7, 8, 9, 10 and 11 illustrate results of steps of a method for manufacturing an image sensor.

At a step illustrated in FIG. 3, it is started from a structure comprising an upper silicon substrate 30 which extends on a silicon support 34 with an interposed insulating layer 32 (structure better known as SOI). As an example, insulating layer 32 may be made of silicon oxide or be formed of a stack of several insulating materials, for example, an oxide-nitride-silicon oxide (ONO) stack. Silicon substrate 30 typically has a thickness ranging between 2 and 10 µm.

Figure 4A:
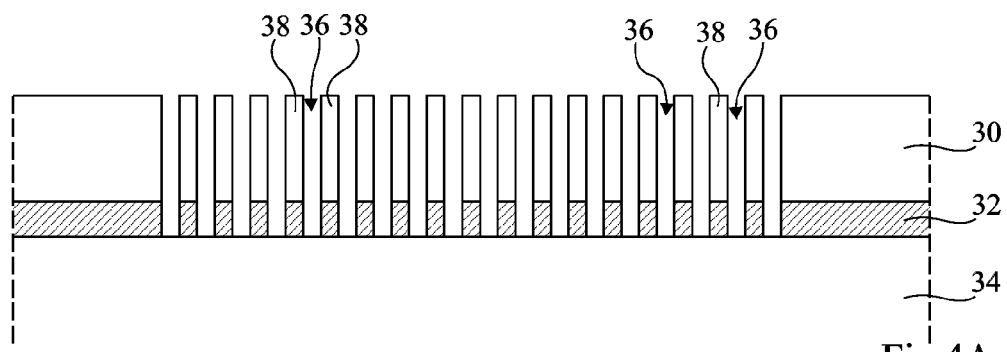
Figure 4B:
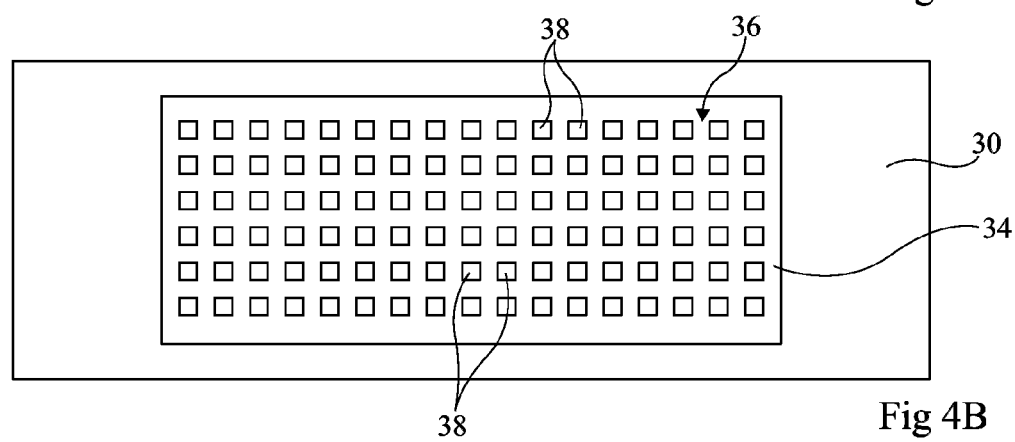

At a subsequent step illustrated in FIGS. 4A and 4B, a set of trenches 36 which extend, from the surface of silicon substrate 30, all the way into insulating layer 32. FIG. 4A is a cross-section view of the obtained device and FIG. 4B is a top view thereof.

Trenches 36 are defined to reach insulating material layer 32, or to thoroughly cross it, so that only columns 38 of silicon substrate 30 remain in a region of the substrate.

The surface of column 38 forms active areas of the image sensor in which the elementary structures of the sensor are defined. In top view, columns 38 forms islands in the middle of trenches 36, for example, evenly distributed in an array.

The surfaces of columns 38 are provided, afterwards, to receive a single pixel or a small number of pixels of the sensor. A maximum number of pixels per active area on the order of 5×5 is here provided. Thus, columns 38 have dimensions, at the substrate surface, smaller than 10 µm.

Preferably, trenches 36 have a small width, for example, smaller than 0.5 µm, for example on the order of 0.2 µm. Trenches 36 may be formed by an etching under plasma, under pulsed plasma, or again a reactive ion etching (better known as RIE). Such etchings are advantageously compatible with the forming of trenches of high form factor, that is, having small widths on a large depth.

Once trenches 36 have been etched, a step of restoring of the walls of columns 38 is provided. Indeed, etching techniques enabling to define trenches of high form factor such as trenches 36 do not enable to obtain perfectly smooth and high-quality walls.

Thus, a step of restoring of the walls of columns 38 is provided, which, for example, comprises oxidizing the walls, then etching the oxide formed thereon. Then, to perform an electric passivation, it may be provided to implant dopants into the walls of columns 38. An activation of the implantation is then carried out, which comprises annealing the structure at a high temperature, for example, on the order of 800° C. It should be noted that such restoring and activation steps could not be carried out at the end of the image sensor manufacturing process, the temperatures involved during these steps causing deformations and damage to a finished structure.

To complete the restoring of trenches 36, an anneal under hydrogen may eventually be carried out to passivate and stabilize residual defects at the surface of the walls of columns 38.

Figure 5:
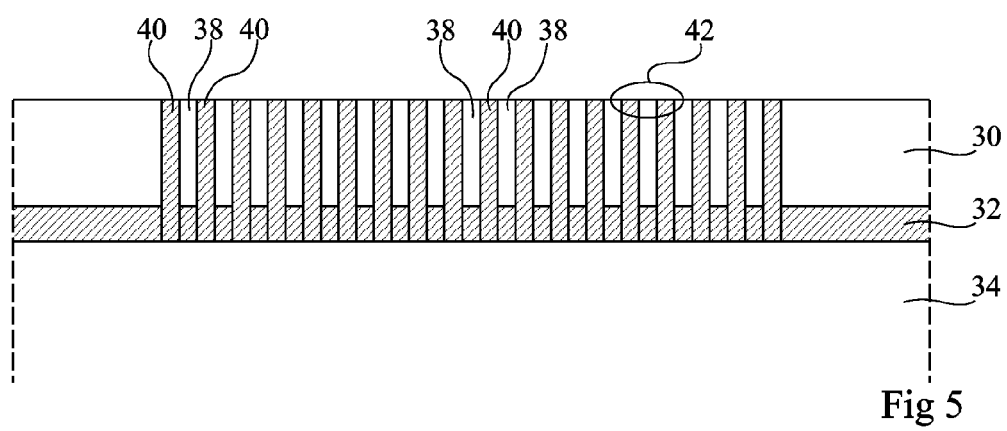

At the step illustrated in FIG. 5, trenches 36 have been filled with an insulating material 40, for example, an oxide such as silicon oxide. Material 40 may also be formed of a first thin layer of an oxide which covers the contour of trenches 36, the volume remaining in trenches 36 being then filled with another material, for example, polysilicon.

Figure 6:
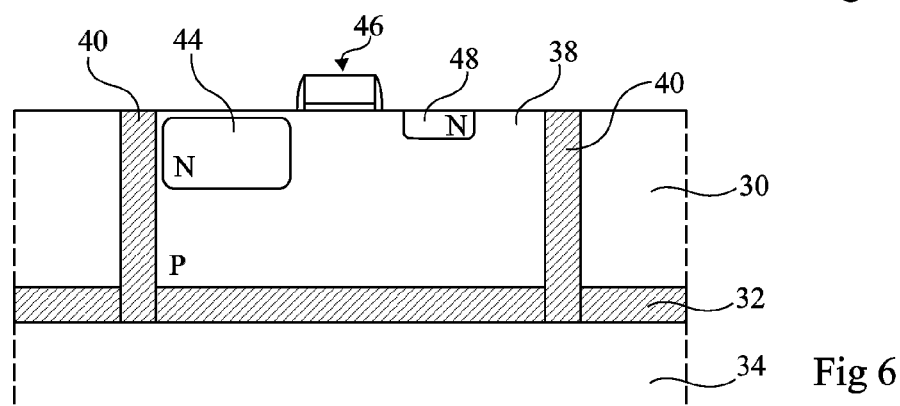

FIG. 6 illustrates, in cross-section view, an enlargement of the surface of a column 38 and of the regions of insulating material 40 which surround it (region 42 in FIG. 5).

At the step illustrated in FIG. 6, one or several image sensor pixels are formed in each of columns 38 defined in substrate 30. In the example of FIG. 6, a single pixel is schematically shown in the upper region of a column 38. In this example, which is by no means a limitation, the pixel is formed of a photodetection and charge collection area 44, of an insulated gate 46 formed at the surface of column 38, and of a read area 48. Other elements may of course be formed in each of columns 38 according to the type of pixel which is considered.

Figure 7:
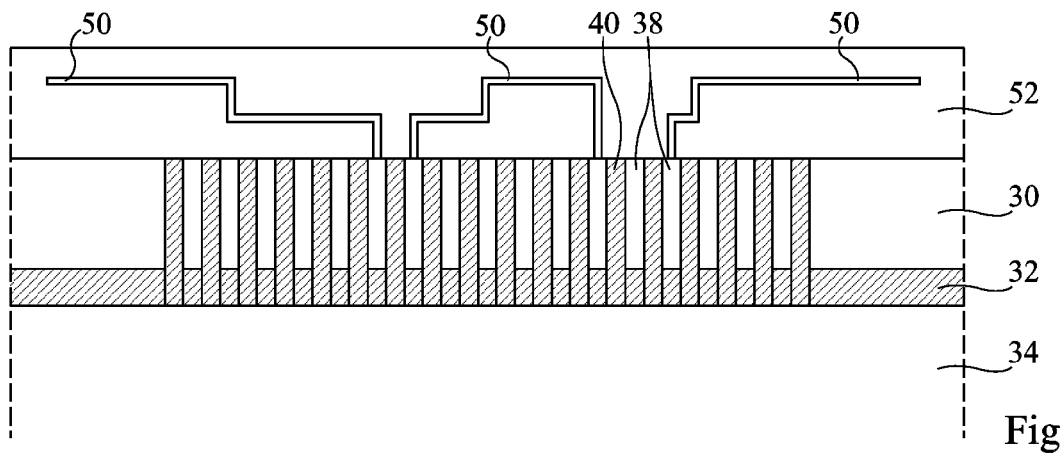

At the step illustrated in FIG. 7, at the surface of substrate 30, a set of interconnection levels comprising conductive tracks and vias 50 insulated by an insulating material 52 has been formed. Conductive tracks and vias 50 are provided to connect the different elements of the image sensor pixels together and, for example, to a system for using the photodetected information.

Figure 8:
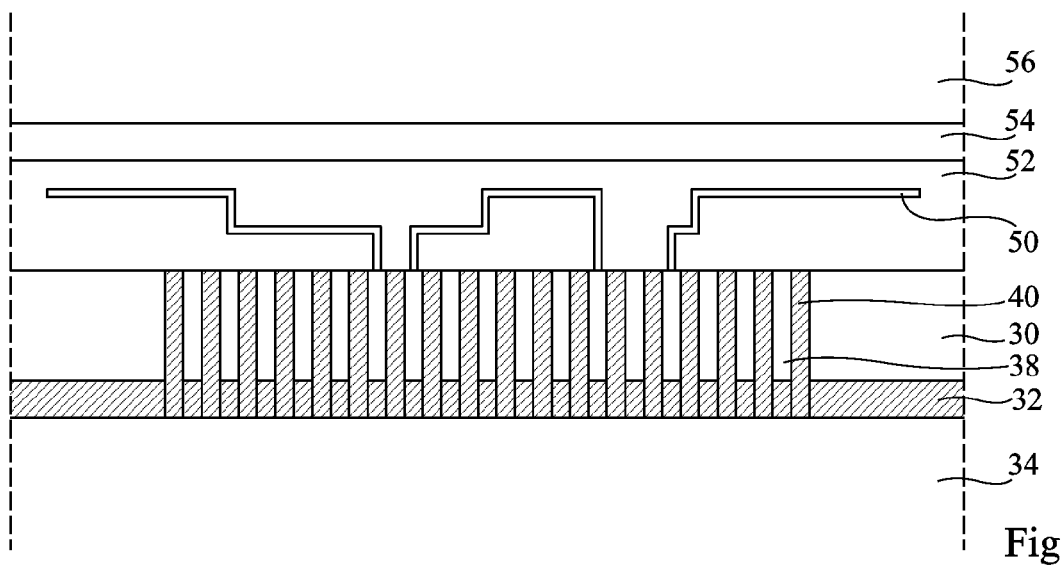

At the step illustrated in FIG. 8, at the surface of interconnection stack 52, a layer 54 of a material capable of deforming without breaking has been formed. As an example, layer 54 may be made of polysilicon. Other materials will be provided hereafter for this layer. Then, a handle 56, for example, made of a semiconductor material, is installed on layer 54. Handle 56 may be a solid silicon wafer, and enables maintaining the device while the manufacturing steps are carried out on the rear surface of the image sensor.

Figure 9:
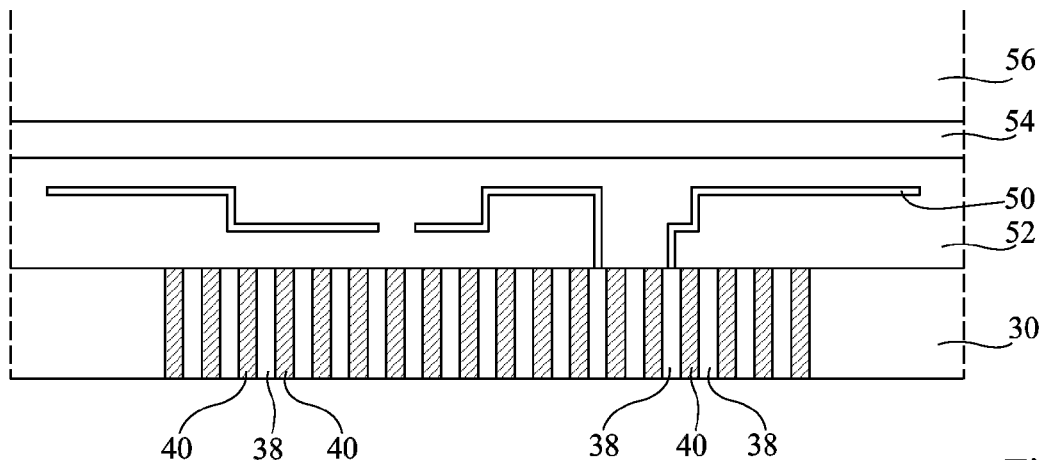

At the step illustrated in FIG. 9, silicon support 34 and insulating layer 32 have been removed. This removal step being relatively conventional, it will not be further described herein. The rear surface of the device is thus located at the level of the lower surface of silicon substrate 30, and the ends of columns 38 opposite to the active areas are accessible.

Figure 10:
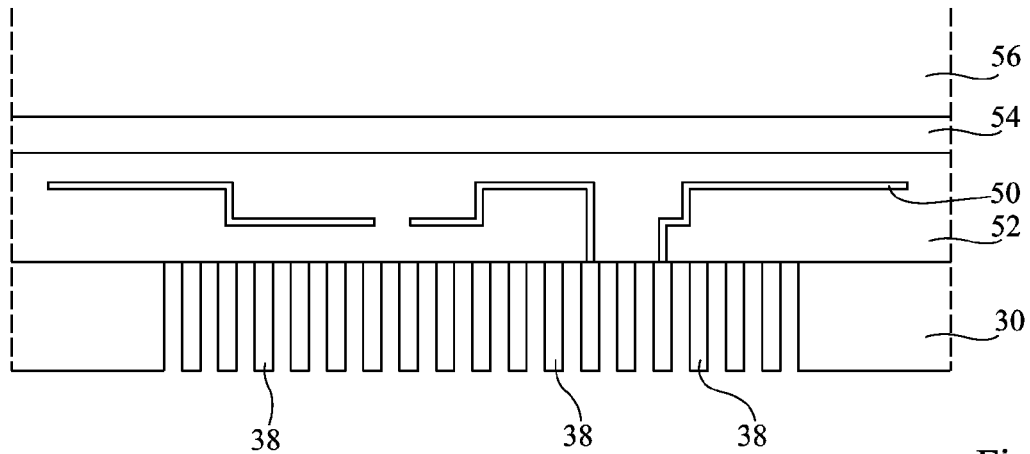

At the step illustrated in FIG. 10, insulating material 40 which extends in trenches 36 has been removed from the rear surface of the device. Once this step has been carried out, it may be provided to carry out a device sawing step to form elementary image sensors which will then be used individually.

Figure 11:
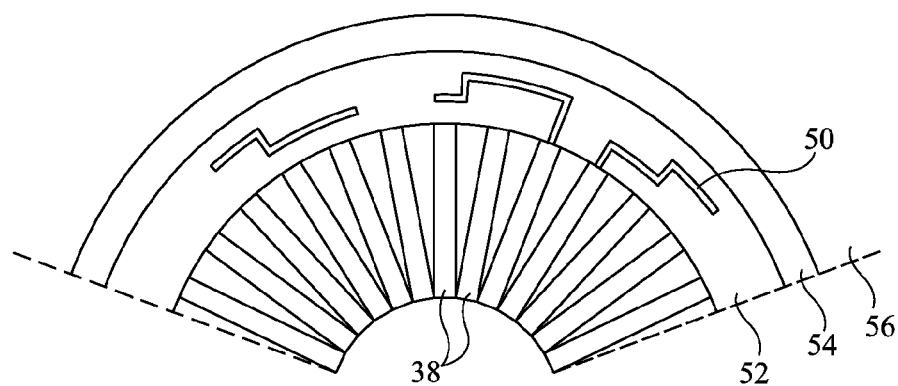

At the step schematically illustrated in FIG. 11, stress has been applied to the entire device to curve it, the rear surface thereof having a hollow curved shape. Due to the above-provided sizing, the rear surfaces of each of columns 38 draw closer to one another until they meet, if need be, so that the rear surface of the device, due to the deformation, has a surface defining a hollow polyhedral cap. Advantageously, the forming of layer 54 enables to avoid the forming of fractures in the rest of the device.

It should be noted that the method provided herein is also compatible with other methods enabling to improve the deformation of the stack of interconnection levels 52, as well as of handle 56.

As a variation, the step of deformation of the device to curve it may be carried out while insulating material 40 is still present if this material is capable of deforming, for example, if it is provided to form a thin layer of insulating material in the trenches, and then to fill the rest of the polysilicon trenches.

Figure 12:
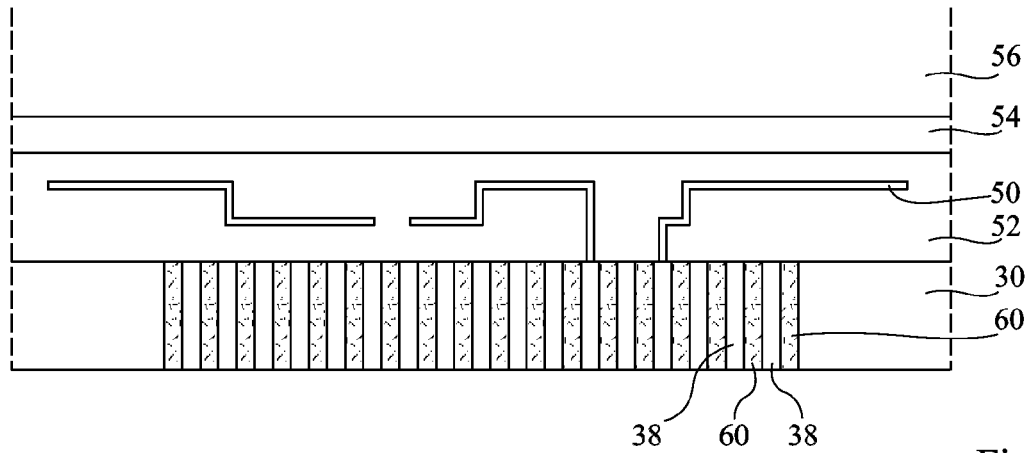
FIGS. 12 and 13 illustrate results of an alternative manufacturing method.
Figure 13:
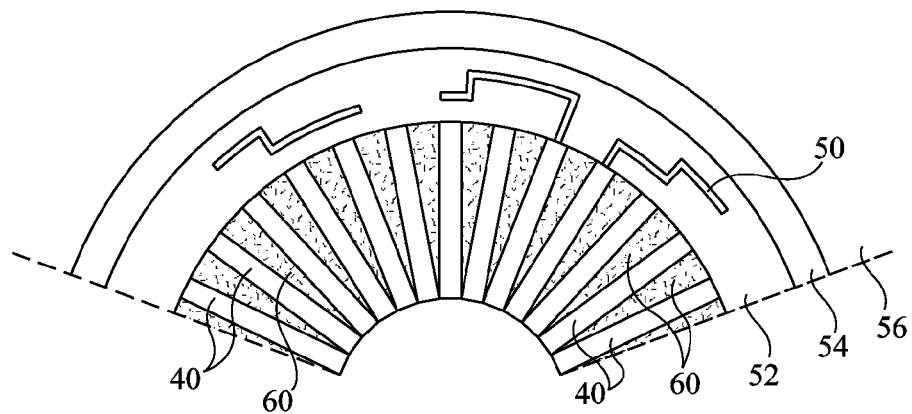

FIGS. 12 and 13 illustrate an alternative embodiment of the above-described method. FIG. 12 illustrates a step carried out after the insulating material removal step of FIG. 10. In the case of FIG. 12, the openings defined by etching of insulating material 40 are filled with a material 60 capable of absorbing mechanical stress, for example, polysilicon. Other examples of materials 60 will be described hereafter.

At the step illustrated in FIG. 13, all devices have been curved in the same way as in the step of FIG. 11. A device having, at its rear surface, a curvature similar to the curvature of the device in FIG. 11, is thus obtained, columns 38 being separated by material 60.

Figure 14:
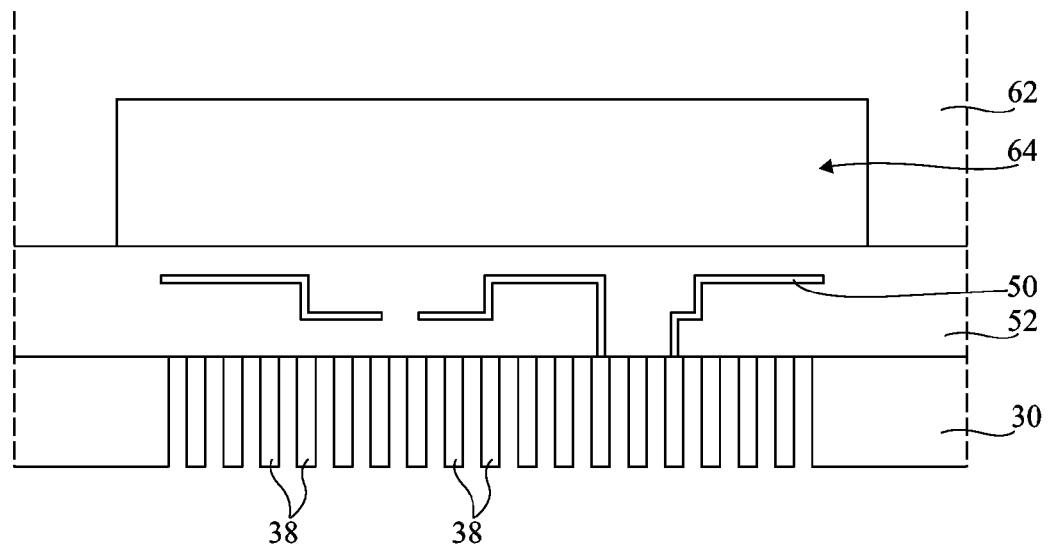
FIG. 14 illustrates a result of a step of a variation of a manufacturing method.

FIG. 14 illustrates a result of a step of another variation of the manufacturing method provided herein, obtained after the step illustrated in FIG. 7.

In the case of FIG. 14, a handle 62 is directly installed on interconnection stack 52, and not via a layer 54.

Handle 62 is provided to have, on its surface placed at the surface of interconnection stack 52, a deep cavity defined at least in front of the set of columns 38.

At a subsequent step, the set of columns 38 and interconnection stack 52 are curved towards cavity 64 defined in handle 62. A device in which only a portion of the assembly formed of silicon substrate 30 and of interconnection stack 52 is curved, at the level of the image sensor pixels, and protruding into cavity 64, is thus obtained. The rear surfaces of columns 38 draw closer to one another, or even meet, as previously, to form a surface defining a hollow polyhedral cap.

It should be noted that the alternative embodiment of FIG. 14 is also compatible with the step of filling of the trenches formed by the removal of insulating material 40 described in relation with FIGS. 12 and 13.

Advantageously, the methods described herein provide image sensors having a relatively small radius of curvature, smaller than 10 mm, or even smaller than 5 mm, without causing fractures in silicon substrate 30.

Further, the definition of trenches 36 around each pixel of the image sensor or a small number of image sensor pixels provides the forming of a full sensor having a uniform curvature over the entire sensor.

Specific embodiments have been described. Various alterations and modifications will occur to those skilled in the art.

In particular, it should be noted that the materials provided herein are not limiting, especially as concerns the materials of regions 54 and 60.

Indeed, although trenches 36 left empty or filled with polysilicon (material 60) have been described herein, trenches 36 may also be filled with silicon oxide ($SiO_2$), with an association of silicon oxide and of polysilicon (the oxide being deposited on the trench walls, the polysilicon filling the space remaining in the trenches), with an association of an oxide and of metal such as copper or aluminum. Trenches 36 may be filled with a polymer, the polymer deposition being performed before the device curvature step. The above materials may also be used to form layer 54 if desired.

It should further be noted that, although trenches 36 have been described as defining vertical columns 38 of square cross-section, different shapes of trenches 36 may be provided so that columns 38 have a polygonal cross-section, adapted to the forming of a polyhedron in the curvature of the device at the end of the process. Columns of rectangular cross-section may also be provided, according to the curvature desired at the end of the process. The columns may also have other shapes, for example, conical or dome-shaped, according to the etch mode used to define them.

Further, although substrate 30 and support 34 have been described herein as being made of silicon, a substrate 30 and a support 34 of another material than silicon may also be provided. The SOI-type substrate provided herein may also be replaced with a solid substrate: in this case, trenches 36 are defined at the surface of a solid substrate at the step of FIG. 4A, and the thinning carried out at the step of FIG. 9 is provided to expose the bottom of trenches 36.

Further, if desired, the stress applied at the steps of FIG. 11 or 13 may be such that the device takes a curvature opposite to what has been shown, that is, so that columns 38 draw away from one another to have a general polyhedral dome shape.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an image sensor, comprising the successive steps of:
   defining, in a semiconductor substrate extending on a semiconductor support with an interposed insulating layer, through trenches delimiting columns, each column having a distal end and a proximal end separate from the distal end;
   forming one or more pixels in the distal end of each of the columns; and
   deforming a structure so that the proximal ends of each of said columns come closer to each other or draw away from each other to form a surface in the shape of a polyhedral cap, wherein the proximal end of each column includes the semiconductor substrate without pixels.

2. The method of claim 1, wherein each of the columns has an upper surface having a dimension that is smaller than 10 µm.

3. The method of claim 1, further comprising, after the defining through trenches, filling the through trenches with an insulating material.

4. The method of claim 3, further comprising, before deforming the structure, removing the insulating material.

5. The method of claim 4, wherein removing the insulating material is followed by filling of the through trenches with a material.

6. The method of claim 1, further comprising, after defining through trenches delimiting columns, forming an interconnection stack over the distal end of the columns.

7. The method of claim 6, further comprising, after the step of forming an interconnection stack, forming a layer over the interconnection stack and removing the semiconductor support and the insulating layer.

8. The method of claim 7, wherein prior to forming the layer over the interconnection stack, forming, on the interconnection stack, a layer of a deformable material.

9. The method of claim 7, wherein prior to forming the layer over the interconnection stack, etching of a cavity at a surface of the layer, said cavity being defined and positioned to coincide, at the installation, with the entire surface defined by the columns.

10. The method of claim 1, wherein defining through trenches delimiting columns is followed by a column wall restoring step.

11. The method of claim 1, wherein defining through trenches delimiting columns comprises at least one of plasma etching, pulsed plasma etching, and reactive ion etching.

12. A method for manufacturing a semiconductor device, the method comprising:
    forming through trenches on a first side of a first semiconductor substrate;
    forming at least one pixel on a second side of the first semiconductor substrate, wherein the second side is a distal end and opposite to and spaced apart from the first side;
    placing a semiconductor support on the second side of the first semiconductor substrate with an insulating layer between the first semiconductor substrate and the semiconductor support;
    positioning the first semiconductor substrate on a surface, wherein the first side of the first semiconductor substrate is the side closest to the surface; and
    deforming the first semiconductor substrate, wherein the first side of the first semiconductor substrate includes semiconductor material and does not include one or more pixels.

13. The method of claim 12, wherein the act of forming through trenches creates columns on the first side of the first semiconductor substrate.

14. The method of claim 13, further comprising:
    restoring the walls of the columns.

15. The method of claim 13, wherein the columns have a dimension smaller than 10 μm.

16. The method of claim 12, wherein the through trenches are formed using at least one of plasma etching, pulsed plasma etching, or reactive ion etching.

17. The method of claim 12, further comprising:
    filling the through trenches with a material.

18. The method of claim 17, wherein the material is an insulating material.

19. The method of claim 12, further comprising:
    forming at least one conductive via in the insulating layer to form an interconnection stack.

20. The method of claim 19, further comprising:
    forming a layer of a deformable material on the interconnection stack.

21. The method of claim 12, wherein the through trenches are patterned in concentric circles.

22. The method of claim 12, wherein the through trenches are patterned in stripes.

23. The method of claim 12, wherein the through trenches are patterned in a rosette.

24. The method of claim 12 wherein deforming the first semiconductor substrate comprises applying stress that causes the first semiconductor substrate to deform.

25. A method comprising:
    forming through trenches in a substrate of semiconductor material, the through trenches delimiting columns having distal first ends and second ends separated from the first ends, the substrate located on an insulating layer over a support, the substrate, the insulating layer, and the support forming a structure;
    filling the through trenches with an insulating material;
    forming a single pixel at the first end of each of the columns;
    removing the insulating material located in the through trenches; and
    deforming the structure in a manner that draws the second ends of each of the columns closer to each other or draw away from each other to form a surface in the shape of a polyhedral cap, wherein the second ends of the columns include the semiconductor material and do not include pixels.

26. The method of claim 25, wherein filling the through trenches comprises filling the through trenches at a first side of the substrate, and wherein removing the insulating material comprises removing the insulating material at a second side of the substrate.

27. The method of claim 25, wherein forming through trenches includes at least one of plasma etching, pulsed plasma etching, and reactive ion etching.

* * * * *